(12) United States Patent
Mikami

(10) Patent No.: US 9,123,913 B2  
(45) Date of Patent: Sep. 1, 2015

(54) ORGANIC ELECTROLUMINESCENCE ELEMENT, LIGHTING DEVICE, AND DISPLAY DEVICE

(75) Inventor: Akiyoshi Mikami, Kanazawa (JP)

(73) Assignee: SUMITOMO CHEMICAL COMPANY, LIMITED, Tokyo (JP)

( * ) Notice: Subject to any disclaimer, the term of this patent is extended or adjusted under 35 U.S.C. 154(b) by 104 days.

(21) Appl. No.: 12/933,561

(22) PCT Filed: Mar. 12, 2009

(86) PCT No.: PCT/JP2009/054789  
§ 371 (c)(1),  
(2), (4) Date: Sep. 20, 2010

(87) PCT Pub. No.: WO2009/119334  
PCT Pub. Date: Oct. 1, 2009

(65) Prior Publication Data  
US 2011/0018023 A1    Jan. 27, 2011

(30) Foreign Application Priority Data  
Mar. 26, 2008    (JP) .................... 2008-081569

(51) Int. Cl.  
*H01L 51/50*    (2006.01)  
*H01L 51/52*    (2006.01)  
*H05B 33/14*    (2006.01)

(52) U.S. Cl.  
CPC ............ *H01L 51/5268* (2013.01); *H05B 33/14* (2013.01); *H01L 2251/5369* (2013.01)

(58) Field of Classification Search  
USPC ....................................... 257/98, 13, E51.018  
See application file for complete search history.

(56) References Cited

U.S. PATENT DOCUMENTS

| | | | |
|---|---|---|---|
| 6,777,871 B2 * | 8/2004 | Duggal et al. ............... 313/506 |
| 7,169,375 B2 * | 1/2007 | Chisholm .................. 423/592.1 |
| 8,125,128 B2 | 2/2012 | Funayama et al. | |
| 2001/0033135 A1 | 10/2001 | Duggal et al. | |
| 2004/0007969 A1 | 1/2004 | Lu et al. | |
| 2004/0183963 A1 * | 9/2004 | Nakamura et al. ............. 349/69 |
| 2005/0023967 A1 | 2/2005 | Gotoh et al. | |

(Continued)

FOREIGN PATENT DOCUMENTS

| | | |
|---|---|---|
| EP | 1 860 919 A1 | 11/2007 |
| JP | H0883688 A | 3/1996 |

(Continued)

OTHER PUBLICATIONS

Japanese Office Action issued in corresponding Japanese Patent Application No. 2008-081569 dated Jun. 12, 2012.

(Continued)

*Primary Examiner* — Sheng Zhu  
(74) *Attorney, Agent, or Firm* — Sughrue Mion, PLLC (57) ABSTRACT

An object of the present invention is to provide an organic EL element having high light extraction efficiency and to provide a lighting device and a display device provided using the organic EL element. The organic EL element 1 includes: a transparent substrate 2 having a refractive index of 1.8 or more; a stacked body 6 that is provided on the substrate 2 and includes at least one pair of electrodes 3 and 4 and an organic light-emitting layer 5 located between the pair of electrodes 3 and 4; and a porous light-scattering body 2a that is provided on a surface of the substrate 2, the surface being opposite to the stacked body 6.

5 Claims, 4 Drawing Sheets

(56) References Cited

U.S. PATENT DOCUMENTS

2005/0142379 A1    6/2005  Juni et al.
2007/0121193 A1*   5/2007  Akashi et al. ................ 359/296
2008/0042154 A1    2/2008  Wano
2008/0274018 A1*  11/2008  Kawai et al. ................ 422/122
2009/0160320 A1*   6/2009  Borner et al. ................ 313/504

FOREIGN PATENT DOCUMENTS

| JP | 2002-260854 A | 9/2002 |
| JP | 2002260845 A | 9/2002 |
| JP | 2003059642 A | 2/2003 |
| JP | 2004-164902 A | 6/2004 |
| JP | 2004-296429 A | 10/2004 |
| JP | 2005-050708 A | 2/2005 |
| JP | 2007-311046 A | 11/2007 |
| WO | 2006/095632 A1 | 9/2006 |

OTHER PUBLICATIONS

Koyanagi, T. et al., "Optical Simulation Analysis of Organic EL Developed by Fresnal's Theory," College of Engineering, Kanazawa Institute of Technology, Oct. 10, 2007 English language Translation.

* cited by examiner

ORGANIC ELECTROLUMINESCENCE ELEMENT, LIGHTING DEVICE, AND DISPLAY DEVICE

CROSS REFERENCE TO RELATED APPLICATIONS

This application is a National Stage of International Application No. PCT/JP2009/054789, filed on Mar. 12, 2009, which claims priority from Japanese Patent Application No. 2008-081569, filed on Mar. 26, 2008, the contents of all of which are incorporated herein by reference in their entirety.

TECHNICAL FIELD

The present invention relates to an organic electroluminescent element, to a lighting device, and to a display device.

BACKGROUND ART

One of the light-emitting elements is an organic electroluminescent element (hereinafter, may be referred to as an organic EL element). The organic EL element is composed of, for example, a pair of electrodes (an anode and a cathode) and an organic light-emitting layer located between the pair of electrodes which are stacking on a substrate. When a voltage is applied to the organic EL element, holes are injected from the anode, and electrons are injected from the cathode. The holes and electrons are recombined in the organic light-emitting layer, and light is thereby emitted. In a so-called bottom emission-type organic EL element, the light emitted from the light-emitting layer is extracted to the outside through the substrate.

A large portion of the light emitted from the organic light-emitting layer is reflected from, for example, the surface of the substrate, and thus the light cannot be efficiently extracted from the organic EL element. In conventional technologies, for example, a number of microlenses are formed on the surface of the substrate to suppress the total reflection of light, and thereby the light extraction efficiency is improved (Patent Document 1).

Patent document 1: JP 2002-260854 A

DISCLOSURE OF THE INVENTION

Problem to be Solved by the Invention

The light extraction efficiency can be improved by forming microlenses or the like on the substrate. However, there is a demand for further improvement in light extraction efficiency.

Accordingly, it is an object of the present invention to provide an organic EL element having high light extraction efficiency and to provide a lighting device and a display device that are provided with the organic EL element.

Means for Solving Problem

To solve the foregoing problem, the present invention provides an organic EL element having the following structure and a device having the organic EL element.

[1] An organic electroluminescent element comprising:
a substrate being transparent and having a refractive index of 1.8 or more;
a stacked body that is provided on the substrate and includes a pair of electrodes and an organic light-emitting layer located between the pair of electrodes; and
a porous light-scattering body that is provided on a surface of the substrate, the surface being opposite to the stacked body.

[2] The organic electroluminescent element according to claim 1, wherein the light-scattering body comprises $TiO_2$.

[3] The organic electroluminescent element according to the above [1] or [2], wherein the light-scattering body is formed by a sol-gel method.

[4] A lighting device comprising the organic electroluminescent element according to any one of [1] to [3].

[5] A display device comprising a plurality of organic electroluminescent elements according to any one of [1] to [3].

Effect of the Invention

According to the present invention, an organic EL element having high light-extraction efficiency can be achieved.

EXPLANATIONS OF LETTERS OR NUMERALS 1, 11 organic EL element
2 substrate
2a light-scattering body
3 transparent electrode
4 reflecting electrode
5 organic light-emitting layer
6 stacked body
7 hole transport layer
L emitted light

BEST MODES(S) FOR CARRYING OUT THE INVENTION

Hereinafter, an embodiment of the present invention will be described with reference to the drawings. To facilitate understanding, the scale of each component in the drawings may be different from the actual scale. The present invention is not limited to the following description, and appropriate modifications may be made as long as they do not deviate from the gist of the present invention. An organic EL device includes components such as lead wires for electrodes. However, these components are not directly necessary for the description of the present invention, and their description is omitted. For the convenience of the description of a layered structure and the like, a substrate is disposed on the lower side in the drawings used for the description of the examples shown below. However, the organic EL element of the present invention and an organic EL device having the organic EL element mounted thereon are not always manufactured or used with the configuration described below. In the following description, one of the thickness directions of the substrate may be referred to as an upward direction or an upper side, and the other thickness direction may be referred to as a downward direction or a lower side.

Figure 1:
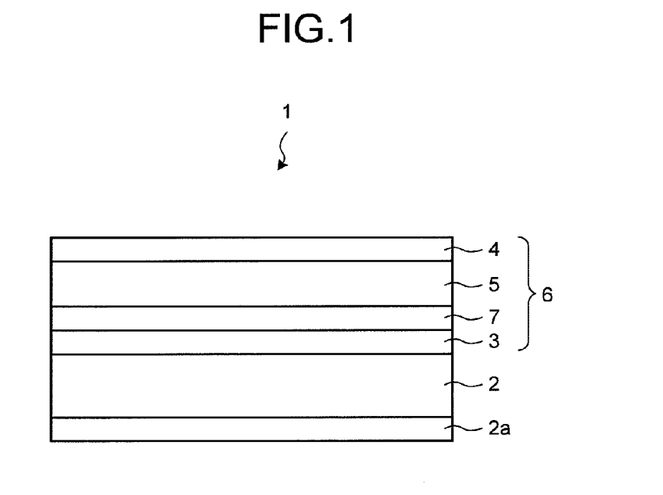
FIG. 1 is a front view illustrating an organic EL element 1 as one embodiment of the present invention.

FIG. 1 is a front view illustrating an organic EL element 1 as one embodiment of the present invention. The organic EL element 1 includes: a substrate 2 being transparent and having a refractive index of 1.8 or more; a stacked body 6 that is provided on the substrate 2 and includes at least one pair of electrodes 3 and 4 and an organic light-emitting layer 5 located between the pair of electrodes 3 and 4; and a porous light-scattering body 2a that is provided on a surface of the substrate 2, the surface being opposite to the stacked body 6.

The organic EL element 1 of the present embodiment is a so-called bottom emission type element in which light is extracted through the transparent substrate 2. The electrode 3 of the pair of electrodes 3 and 4, which is disposed on the substrate 2 side based on the organic light-emitting layer 5, is transparent, and this electrode 3 may be referred to as a transparent electrode 3 in the following description. In this present embodiment, the electrode 4 of the pair of electrodes 3 and 4, which is disposed on a side opposite to the substrate 2 side based on the organic light-emitting layer 5, is formed of a material that reflects the light emitted from the organic light-emitting layer 5 toward the substrate 2 side in order to improve light-extraction efficiency, and this electrode 4 may be referred to as a reflecting electrode 4 in the following description. When the organic EL element 1 is of the two-sided emission type, the electrode 4 of the pair of electrodes 3 and 4, which is disposed on the side opposite to the substrate 2 based on the organic light-emitting layer 5, is a transparent electrode. In the present invention, the term "transparent" means that the transmission of light is allowed. The term "light" means an electromagnetic wave having a wavelength of about 1 nm to about 1 mm. In consideration of the applications of the organic EL element, the light may be mainly visible light. The transparency of the transparent substrate, transparent electrodes and the like depends on various factors such as material and thickness. When the light transmittance is defined as the ratio of the amount of output light to the amount of input light, the light transmittance of the transparent substrate, transparent electrodes and the like is, for example, 10% or more, preferably 25% or more, more preferably 50% or more, further preferably 70% or more, and even more preferably 80% or more.

One or a plurality of layers different from the organic light-emitting layer 5 may be provided between the transparent electrode 3 and the organic light-emitting layer 5 and/or between the reflecting electrode 4 and the organic light-emitting layer 5. A plurality of organic light-emitting layers may be provided between the transparent electrode 3 and the reflecting electrode 4. A thin film such as a transparent insulating layer may be provided between the substrate 2 and the stacked body. In the organic EL element 1 in the present embodiment, a hole transport layer 7 is provided between the transparent electrode 3 and the organic light-emitting layer 5, and the transparent electrode 3, the hole transport layer 7, the organic light-emitting layer 5, and the reflecting electrode 4 are stacked in this order on the surface of the substrate 2.

The refractive index of the organic light-emitting layer 5 is generally about 1.6 to 1.7. In the description below, based on the refractive index of the organic light-emitting layer 5, a substrate having a refractive index less than that of the organic light-emitting layer 5 may be referred to as a Low-N substrate, and a substrate having a refractive index greater than that of the organic light-emitting layer 5 may be referred to as a High-N substrate. The refractive index of a general glass substrate is about 1.5. In organic EL elements, a Low-N substrate having a refractive index of about 1.5 is generally used. However, in the present embodiment, a High-N substrate having a refractive index of 1.8 or more is used. To show the superiority of the organic EL element 1 in the present embodiment, it is explained through a comparison between an organic EL element using a Low-N substrate and an organic EL element using a High-N substrate.

First, a description is given of an organic EL element comprising: the substrate 2 which is not accompanied with the light-scattering body; and the stacked body 6 which is provided on the substrate 2 and includes the organic light-emitting layer, that is, the organic EL element in which the light-scattering body is excluded from the substrate 2 shown in FIG. 1. As described later, in the organic EL element using a substrate that is not provided with a light-scattering body, partial reflection of the light at the interface between air and the substrate occurs, or total reflection of the light occurs at the interface. However, by providing the light-scattering body 2a as in the embodiment shown in FIG. 1, light scattering, for example, occurs in the light-scattering body 2a. This can suppress the partial reflection and the total reflection of light, so that the light extraction efficiency can be improved.

Figure 2:
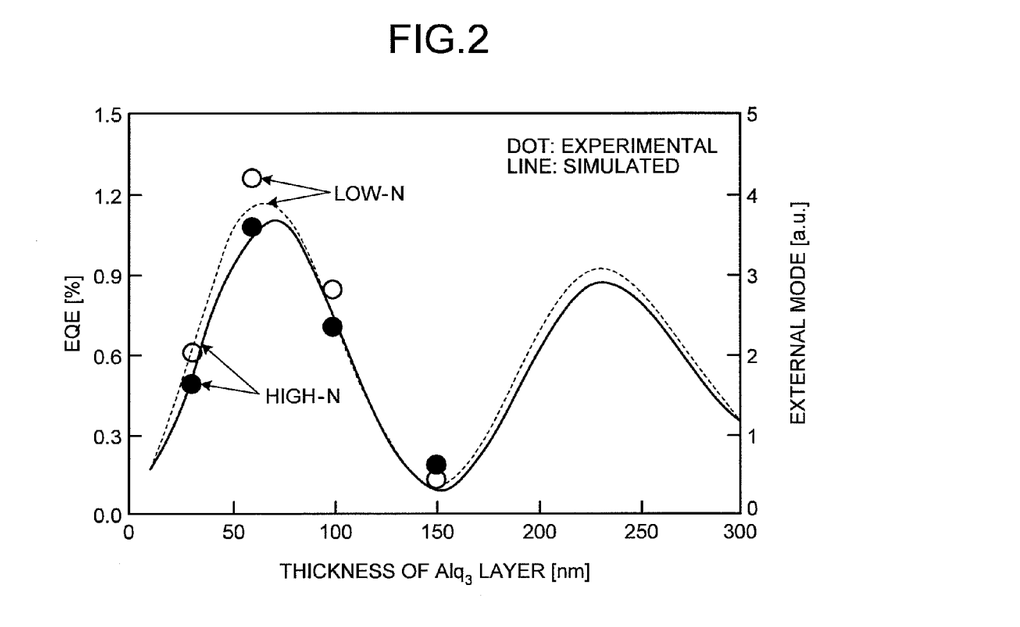
FIG. 2 is a graph showing changes in external quantum efficiency when the thickness of an organic light-emitting layer ($Alq_3$) is changed.

The thickness of an organic EL element in its stacking direction is in the order of the wavelength of light, and therefore the interference of light influences the characteristics of the extracted light. For example, when the thickness of the organic light-emitting layer is changed, the external quantum efficiency (EQE) is changed. FIG. 2 is a graph showing changes in external quantum efficiency when the thickness of an organic light-emitting layer ($Alq_3$) is changed. FIG. 2 shows the external quantum efficiencies of elements actually produced and the external quantum efficiencies determined by simulations. More specifically, the external quantum efficiency of an element using a Low-N substrate is represented by open circles (○), and the external quantum efficiency of an element using a High-N substrate is represented by solid circles (●). Then, the simulated external quantum efficiency of a model element using the Low-N substrate is represented by a broken line, and the simulated external quantum efficiency of a model element using the High-N substrate is represented by a solid line. The left vertical axis of FIG. 2 represents the external quantum efficiency of each element actually produced, and the right vertical axis represents the external quantum efficiency (arbitrary unit) determined by the simulations. In the elements actually produced and the analysis models applied in the simulations, the refractive index of the Low-N substrate was 1.52; the refractive index of the High-N substrate was 2.02; the transparent electrode was an ITO thin film; the hole transport layer was formed of α-NPD; the organic light-emitting layer was formed of $Alq_3$; and the reflecting electrode was formed of Al. The thickness of the substrates was 0.7 mm; the thickness of the transparent electrode (ITO) was 150 nm; the thickness of the hole transport layer was 40 nm; and the thickness of the reflecting electrode was 200 nm. Changing the thickness of the organic light-emitting layer corresponds to changing the distance between the reflecting electrode and the transparent electrode.

The simulations may be performed using a theoretical computational program based on wave optics, for example, a combination of light-interference computation based on the Fresnel theory and computation of an effective Fresnel coefficient using a characteristic matrix method. The following conditions, for example, may be used as the set conditions (initial conditions) of the computation:

(a) Light is assumed to be isotropically emitted from point-light sources randomly distributed in a light-emitting area.
(b) The forward wave and backward wave emitted from a single light source have the same phase and interfere with each other, but the waves emitted from different point-light sources do not interfere with each other.
(c) The interfaces between adjacent layers are assumed to be optically flat.
(d) The emission intensity is represented as the average value of the intensities of p-polarized light and s-polarized light.
(e) As to the dispersion characteristic of the refractive index and the characteristic of the light absorption, the actually measured values of each layer are used.

A more detailed exemplary computational method is described below for reference.

As shown in FIG. 2, it was observed that the external quantum efficiencies of the elements actually produced and the external quantum efficiencies determined by the simulations varied in an oscillating manner when the thicknesses of the organic light-emitting layers (the thickness of $Alq_3$) were changed. The light emitted from an organic light-emitting layer toward a reflecting electrode and reflected from the reflecting electrode is superposed with the light emitted from the organic light-emitting layer toward a transparent electrode. Due to the interference effects of light, the external quantum efficiency increases under constructive interference conditions, and the external quantum efficiency decreases under destructive interference conditions. When the thickness of the organic light-emitting layer is changed, the constructive interference conditions and the destructive interference conditions occur alternately. Therefore, it is assumed that the external quantum efficiency varies in an oscillating manner.

Part of the light emitted from the organic light-emitting layer is extracted to the outside, and the rest is reflected at the surface of the substrate and the like and is not extracted to the outside. Hereinafter, the light emitted from the organic light-emitting layer and extracted to the outside is referred to as an external mode; the light guided by the substrate and trapped in the substrate is referred to as a substrate mode; and the light guided between the transparent electrode and the reflecting electrode and trapped between these electrodes is referred to as a thin-film waveguide mode (waveguide mode).

Figure 3:
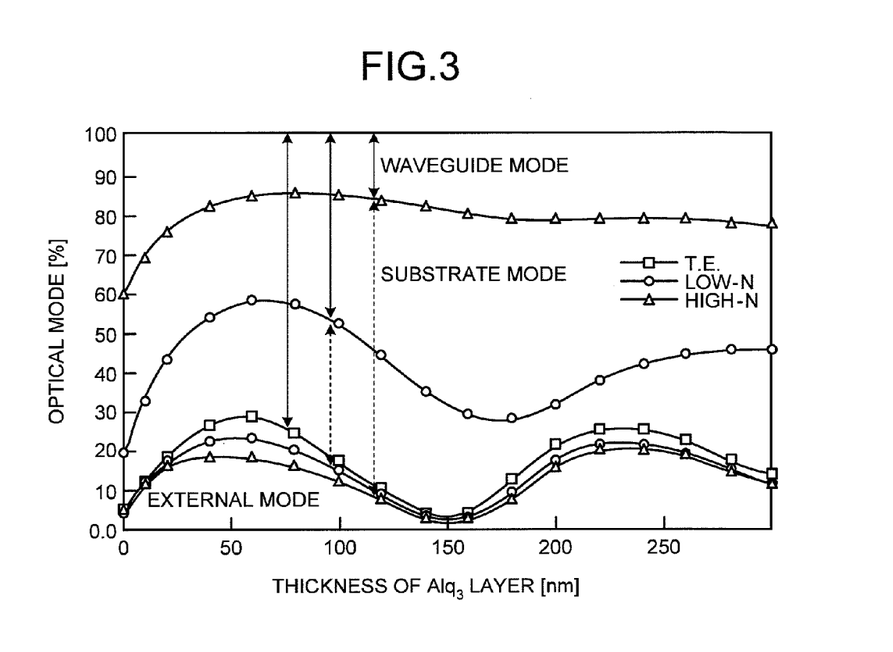
FIG. 3 is a graph showing optical modes changes expressing in ratio of an external mode, a substrate mode and a thin-film waveguide mode, when the thickness of the organic light-emitting layer ($Alq_3$) is changed.

FIG. 3 is a graph showing change of the optical modes in the percentage of the external mode, substrate mode, and thin-film waveguide mode, when the thickness of each organic light-emitting layer ($Alq_3$) is changed. In FIG. 3, the modes of the organic EL element using the Low-N substrate are represented using open circles (○), and the modes of the organic EL element using the High-N substrate are represented using open triangles (Δ). It was normalized that the sum of the amounts of the external mode, substrate mode, and thin-film waveguide mode was 100%. In FIG. 3, the optical mode of a top emission (T. E.) type organic EL element having a substrate with a refractive index of 1.0 is also shown using open squares (□) for reference. In FIG. 3, each organic EL element (except for the T. E. element) has three regions divided by two solid lines. Among these three regions, the lower region represents the external mode; the region sandwiched between the two solid lines represents the substrate mode; and the upper region represents the thin-film waveguide mode.

In FIG. 3, the substrate mode region is represented by a broken-line arrow, and the thin-film waveguide mode region is represented by a solid-line arrow. Since the T. E. element has no substrate mode, no region is represented by an broken-line arrow. As shown in FIG. 3, in the organic EL element using the High-N substrate, most of the light is in the substrate mode (the region represented by the right broken-line arrow in FIG. 3) and trapped in the substrate. On the other hand, in the organic EL element using the Low-N substrate, the percentage of the substrate mode (the region represented by the left broken-line arrow in FIG. 3) is substantially the same as the percentage of the thin-film waveguide mode (the region represented by an solid-line arrow), or the percentage of the thin-film waveguide mode is slightly greater than the percentage of the substrate mode.

When comparing only the percentages of the external mode that represents the amount of light extracted, the external mode percentage of the organic EL element using the Low-N substrate is greater than that of the organic EL element using the High-N substrate. When no light-scattering body is provided, it is assumed that the use of the Low-N substrate is more preferable than the use of the High-N substrate. This corresponds to the fact that Low-N substrates have been used in conventional organic EL elements.

Figure 4:
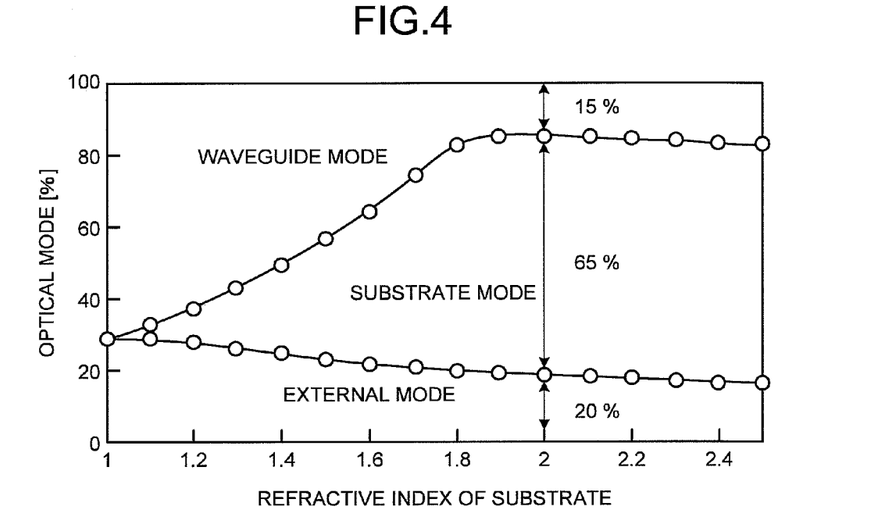
FIG. 4 is a graph showing changes of the optical modes, when the thickness of each layer of an organic EL element is held constant and the refractive index of a substrate is changed.

FIG. 4 is a graph showing the optical modes changes, when the thickness of each layer of an organic EL element is provided as a constant and the refractive index of a substrate is changed. The layered structure of the model used in this simulation was the same as that of the model used in the simulation shown in FIG. 3. In this simulation, the thickness of the organic light-emitting layer ($Alq_3$) was fixed to 50 nm, and the simulations of the optical modes were performed by changing the refractive index of the substrate. The optical modes of the T. E. organic EL element with a thickness of the organic light-emitting layer of 50 nm in FIG. 3 correspond to the optical modes at a refractive index of the substrate of "1" in FIG. 4. The optical modes of the organic EL element using the Low-N substrate at a thickness of the organic light-emitting layer of 50 nm in FIG. 3 correspond to the optical modes at a refractive index of the substrate of "1.52" in FIG. 4. The optical modes of the organic EL element using the High-N substrate at a thickness of the organic light-emitting layer of 50 nm in FIG. 3 correspond to the optical modes at a refractive index of the substrate of "2.02" in FIG. 4.

As clear from FIGS. 3 and 4, the percentages of the external mode that represent the amounts of extracted light are low, and considerable amounts of emitted light are trapped as a substrate mode or a thin-film waveguide mode in the organic EL elements and are not extracted to the outside.

As shown in FIG. 1, in the embodiment of the present invention, the light-scattering body 2a is provided on the surface of the substrate 2. With this configuration, part of a light in the substrate mode, which is trapped in the substrate and is not extracted to the outside when no light-scattering body is provided, can be converted to the light in the external mode, and the light-extraction efficiency is thereby improved. This method of improving the light-extraction efficiency by providing a light-scattering body has been used conventionally. When such the light-scattering body is not provided, the use of a Low-N substrate gives a higher external mode, as described above. Therefore, a light-scattering body is generally provided on a Low-N substrate. However, in the present embodiment, to achieve a further improvement in the light-extraction efficiency, the light-scattering body is provided on a High-N substrate instead.

As shown in FIGS. 3 and 4, the percentage of the external mode in the organic EL element using the High-N substrate is not significantly different from that in the organic EL element using the Low-N substrate. However, the ratio between the substrate mode and the thin-film waveguide mode is significantly different. More specifically, in the organic EL element using the High-N substrate, the percentage of the substrate mode is greater than the percentage of the thin-film waveguide mode, and therefore most of the light trapped in the organic EL element is trapped in the substrate. On the other hand, in the organic EL element using the Low-N substrate, the percentage of the substrate mode is comparable to the percentage of the thin-film waveguide mode, and the light trapped in the organic EL element is substantially equally distributed in the substrate and between the electrodes. As described above, the light-scattering body provided on the substrate functions such that part of a light in the substrate mode is converted to light in the external mode. Therefore, when the light-scattering body is applied to a High-N substrate that gives a higher percentage of the substrate mode, the light-extraction efficiency can be significantly improved as compared to that by the ordinary method in which the light-scattering body is provided on a Low-N substrate.

As shown in FIGS. 2 and 3, the external mode varies in an oscillating manner depending on the thickness of the organic light-emitting layer that corresponds to the change in the distance between the electrodes. In the present embodiment, it is preferable that the distance between the electrodes is set to (1) a length that gives nearly a local maximum of the external mode, under the condition that the light-scattering body is not provided, and more preferably, this distance is set to a length that gives mostly the maximum of the external mode. When the light-scattering body is provided in an organic EL element having a structure in which the substrate mode becomes nearly a local maximum under the condition that the light-scattering body is not provided, the light-extraction efficiency is expected to be significantly improved. Therefore, in addition to the above range, it is preferable that the distance between the electrodes is set to (2) a length that gives nearly a local maximum of the substrate mode, under the condition that the light-scattering body is not provided, and more preferably, this distance is set to a length that gives mostly the maximum of the substrate mode. It is also preferable that the distance between the electrodes is set to (3) a length that gives nearly a local maximum of the sum of the external mode and the substrate mode, when the light-scattering body is not provided, in other words, a length that gives a minimum of the thin-film waveguide mode, and more preferably, this distance is set to a length that gives mostly a minimum of the thin-film waveguide mode.

The refractive index n1 of the substrate is preferably 1.8 or more, and the difference between the refractive index n1 and the refractive index n2 of the transparent electrode (n1−n2) is preferably −0.1 or more. The refractive indexes of an ITO thin film and an IZO thin film (described later) are about 1.9 to about 2.0. Therefore, these thin films may be preferably used as the transparent electrode of the organic EL element in the present embodiment in which the substrate having a refractive index of 1.8 or more is used. When a transparent electrode formed of an organic material is used, any substrate having a relatively low refractive index may be used so long as the refractive index is 1.8 or more.

Next, a description is given of the structure of the organic EL element and a method of producing this element. As described above, in addition to one organic light-emitting layer, a plurality of layers may be provided between the electrodes. One of the pair of electrodes functions as an anode, and the other functions as a cathode. In the present embodiment, the transparent electrode 3 functions as an anode, and the reflecting electrode 4 functions as a cathode. However, the anode may be a reflecting electrode, and the cathode may be a transparent electrode.

The layer provided between the cathode and the organic light-emitting layer may be an electron injection layer, an electron transport layer, a hole block layer or the like. When both the electron injection layer and the electron transport layer are provided between the cathode and the organic light-emitting layer, a layer close to the cathode is referred to as the electron injection layer, and a layer close to the organic light-emitting layer is referred to as the electron transport layer.

The electron injection layer has a function of improving election-injection efficiency from the cathode. The electron transport layer has a function of improving election injection from the cathode, the electron injection layer, or another electron transport layer closer to the cathode. The hole block layer has a function of blocking transport of holes. When the electron injection layer and/or the electron transport layer has a function of blocking transport of holes, any of these layers may also serve as the hole block layer.

Whether or not the hole block layer has a function of blocking transport of holes can be determined, for example, by producing an element that allows only a hole current to flow and measuring the reduction in the current value to examine the effects of blocking.

The layer provided between the anode and the organic light-emitting layer may be a hole injection layer, a hole transport layer, an electron block layer or the like. When both the hole injection layer and the hole transport layer are provided, a layer close to the anode is referred to as the hole injection layer is, and a layer close to the organic light-emitting layer is referred to as the hole transport layer is.

The hole injection layer has a function of improving hole-injection efficiency from the anode. The hole transport layer has a function of improving hole injection from the anode, the hole injection layer, or another hole transport layer closer to the anode. The electron block layer has a function of blocking transport of electrons. When the hole injection layer and/or the hole transport layer has a function of blocking transport of electrons, any of these layers may also serve as the electron block layer.

Whether or not the electron block layer has a function of blocking transport of electrons can be determined, for example, by producing an element that allows only an electron current to flow and measuring the reduction in the current value to examine the effects of blocking.

The electron injection layer and the hole injection layer may be collectively referred to as the charge injection layers, and the electron transport layer and the hole transport layer may be collectively referred to as the charge transport layers.

<Substrate>

The substrate used is transparent and has a refractive index of 1.8 or more. A substrate that does not change its properties during the process of producing the organic EL element is preferably used. For example, any of glass, plastic, polymer film, and silicon substrates and laminates thereof may be used. The substrate being transparent and having a refractive index of 1.8 or more is available as a commercial product.

<Light-Scattering Body>

The light-scattering body provided on the surface of the substrate is composed of a porous light-scattering body.

The size of the pores formed in the porous light-scattering body is preferably comparable to the wavelength of light and is, for example, 400 nm to 1000 nm. Preferably, the porous light-scattering body contains $TiO_2$. The porous light-scattering body may be formed by the sol-gel method. More specifically, the porous light-scattering body may be formed by, for example, applying a titania sol produced by hydrolysis and polymerization of a titanium alkoxide to the substrate to form a film and firing the produced film. The titania sol may be obtained, for example, by mixing and stirring titanium tetraisopropoxide, water and ethanol. The density of the pores may be adjusted by adding an acid catalyst such as hydrochloric acid when the titania sol is hydrolyzed. The higher the concentration of the acid catalyst is, the higher the density of the pores becomes.

In one modified embodiment, a light-scattering body produced by embedding, in a base material having a first refractive index, fine particles having a second refractive index different from the first refractive index is provided on the surface of the substrate.

The base material having the first refractive index may be resins. The fine particles having the second refractive index may be fine particles of inorganic oxides, inorganic fluorides, inorganic sulfides, inorganic carbonates or the like, and specifically may be fine particles of titania, zirconia, barium sulfate, calcium sulfate, magnesia, barium carbonate, barium oxide, calcium oxide, barium titanate, zinc oxide or the like. The fine particles having the second refractive index may be any of spherical, polyhedral-like, whisker-like, or plate-like particles. The average size of the fine particles having the second refractive index is preferably about in the range of 0.1 to 5.0 µm, more preferably 0.1 to 4.0 µm, and more preferably 0.1 to 2.0 µm. When the average particle size is in the above range, sufficient light-scattering effects can be obtained. Preferably, the fine particles are spherical so that the light-scattering effects are improved.

To suppress the reflection of light at the interface between the substrate and the base material, it is preferable that the first refractive index be substantially the same as the refractive index of the substrate. To suppress the total reflection, it is preferable that the first refractive index be substantially the same as or greater than the refractive index of the substrate.

This light-scattering body may be formed as follows. A coating solution produced by dispersing the above fine particles in a resin is applied to the substrate using a coating method such as spin coating, roll coating, or cast coating to form a film. When a photo-curable resin is used, the film is irradiated with UV rays and then heat-cured if necessary. When a heat-curable resin is used, the formed film is directly heat-cured after forming a film.

<Transparent Electrode>

As the transparent electrode, a thin film of a metal oxide, metal sulfide, or metal having high electric conductivity may be used. A thin film having high light-transmittance is preferably used. More specifically, any of thin films of indium oxide, zinc oxide, tin oxide, ITO (indium-tin oxide, indium oxide), IZO (indium-zinc oxide: indium zinc tin oxide), gold, platinum, silver, and copper may be used. Among these, thin films of ITO, IZO, or tin oxide may be preferably used. The method of producing the transparent electrode may be vacuum deposition, sputtering, ion plating, plating methods or the like. Any of organic transparent conductive films such as the film made of polyaniline or derivatives thereof and polythiophene or derivatives thereof may be used as the transparent electrode.

The thickness of the transparent electrode may be appropriately selected in consideration of its light transmittance and electric conductivity. The thickness is, for example, 10 nm to 10 µm, preferably 20 nm to 1 µm, and more preferably 50 nm to 500 nm.

<Hole Injection Layer>

Examples of the hole injection material that forms the hole injection layer may include: oxides such as vanadium oxide, molybdenum oxide, ruthenium oxide, and aluminum oxide; phenylamine-based compounds; starburst amine-based compounds; phthalocyanine-based compounds; amorphous carbon; polyaniline; and polythiophene derivatives.

Examples of the method for forming the hole injection layer may include film formation using a solution containing the hole injection material. No particular limitation is imposed on the solvent used for the film formation using a solution, so long as the solvent may dissolve the hole injection material. Examples of the solvent may include: chlorine-based solvents such as chloroform, methylene chloride, and dichloroethane; ether-based solvents such as tetrahydrofuran; aromatic hydrocarbon-based solvents such as toluene and xylene; ketone-based solvents such as acetone and methyl ethyl ketone; ester-based solvents such as ethyl acetate, butyl acetate, and ethyl cellosolve acetate; and water.

Examples of the method of film formation using a solution may include coating methods such as spin coating, casting, micro-gravure coating, gravure coating, bar coating, roll coating, wire bar coating, dip coating, spray coating, screen printing, flexographic printing, offset printing, and ink-jet printing methods.

The optimal thickness of the hole injection layer varies depending on the material used and is appropriately set such that appropriate driving voltage and light-emission efficiency are obtained, but the hole injection layer needs to have a thickness at least sufficient for preventing the formation of pinholes. When the thickness is too large, the driving voltage of the element becomes undesirably high. Therefore, the thickness of the hole injection layer is, for example, 1 nm to 1 µm, preferably 2 nm to 500 nm, and more preferably 5 nm to 200 nm.

<Hole Transport Layer>

Examples of the hole transport material that forms the hole transport layer may include polyvinylcarbazole and derivatives thereof, polysilane and derivatives thereof, polysiloxane derivatives having an aromatic amine in their side chain or main chain, pyrazoline derivatives, arylamine derivatives, stilbene derivatives, triphenyldiamine derivatives, polyaniline and derivatives thereof, polythiophene and derivatives thereof, polyarylamine and derivatives thereof, polypyrrole and derivatives thereof, poly(p-phenylene vinylene) and derivatives thereof, and poly(2,5-thienylene vinylene) and derivatives thereof.

Among these, polymer hole transport materials are used preferably as the hole transport material. Examples of such polymer hole transport materials may include polyvinylcarbazole and derivatives thereof, polysilane and derivatives thereof, polysiloxane derivatives having an aromatic amine compound group in their side chain or main chain, polyaniline and derivatives thereof, polythiophene and derivatives thereof, polyarylamine and derivatives thereof, poly(p-phenylene vinylene) and derivatives thereof, and poly(2,5-thienylene vinylene) and derivatives thereof. More preferred examples may include polyvinylcarbazole and derivatives thereof, polysilane and derivatives thereof, and polysiloxane derivatives having an aromatic amine in their side chain or main chain. When a hole transport material having a low-molecular weight is used, it is preferable that the transport material is dispersed in a high molecular weight binder.

No particular limitation is imposed on the method for forming the hole transport layer. Examples of the method for forming a hole transport material having a low-molecular weight may include film formation using a solution mixture containing the hole transport material and a high molecular weight of binder. Examples of the method for forming by using a hole transport material having a high-molecular weight may include film formation using a solution containing the hole transport material.

No particular limitation is imposed on the solvent used for the film formation using a solution, so long as the solvent can dissolve the hole transport material. Examples of the solvent may include: chlorine-based solvents such as chloroform, methylene chloride, and dichloroethane; ether-based solvents such as tetrahydrofuran; aromatic hydrocarbon-based solvents such as toluene and xylene; ketone-based solvents such as acetone and methyl ethyl ketone; and ester-based solvents such as ethyl acetate, butyl acetate, and ethyl cellosolve acetate.

As the method of film formation using a solution, a coating method similar to the method for forming the hole injection layer described in the above may be used.

As the high molecular weight binder to be mixed, a binder which does not excessively inhibit charge transport is preferable, and a binder which absorbs only a small amount of visible light is preferably used. Examples of such binders may include polycarbonate, polyacrylate, polymethylacrylate, polymethylmethacrylate, polystyrene, polyvinylchloride, and polysiloxane.

The hole transport layer may be formed by vapor deposition of α-NPD described above.

The optimal thickness of the hole transport layer varies depending on the material used and is appropriately set such that appropriate driving voltage and light-emission efficiency are obtained, but the hole transport layer needs to have a thickness at least sufficient for preventing the formation of pinholes. When the thickness is too large, the driving voltage of the element becomes undesirably high. Therefore, the thickness of the hole transport layer is, for example, 1 nm to 1 µm, preferably 2 nm to 500 nm, and more preferably 5 nm to 200 nm.

<Organic Light-Emitting Layer>

The organic light-emitting layer is generally formed of an organic material that mainly emits fluorescence and/or phosphorescence or of the organic material and an assist dopant therefor. The dopant is added for the purpose of improving the light-emission efficiency and changing the wavelength of emitted light. The organic material may be any of a low-molecular compound and a macromolecular compound. Examples of the light-emitting material that forms the organic light-emitting layer include the following dye-based materials, metal complex-based materials, polymer-based materials, and dopant materials.

(Dye-Based Materials)

Examples of the dye-based materials may include cyclopendamine derivatives, tetraphenyl butadiene derivative compounds, triphenylamine derivatives, oxadiazole derivatives, pyrazoloquinoline derivatives, distyrylbenzene derivatives, distyrylarylene derivatives, pyrrole derivatives, thiophene ring compounds, pyridine ring compounds, perinone derivatives, perylene derivatives, oligothiophene derivatives, oxadiazole dimer, pyrazoline dimer, quinacridone derivatives, and coumarin derivatives.

(Metal Complex-Based Material)

Examples of the metal complex-based material may include metal complexes having central metals such as Al, Zn, Be or rare earth metals such as Tb, Eu and Dy and ligands such as oxadiazole, thiadiazole, phenylpyridine, phenylbenzimidazole, and a quinoline structure. Specific examples of the metal complex-based material may include metal complexes, such as iridium complexes and platinum complexes, that emit light from a triplet excitation state, an aluminum quinolinol complex, a benzoquinolinol beryllium complex, a benzoxazolyl zinc complex, a benzothiazole zinc complex, an azomethyl zinc complex, a porphyrin zinc complex, and europium complexes.

(Polymer-Based Material)

Examples of the polymer-based material may include poly-p-phenylene vinylene derivatives, polythiophene derivatives, poly-p-phenylene derivatives, polysilane derivatives, polyacetylene derivatives, polyfluorene derivatives, polyvinylcarbazole derivatives, and polymerized products of the above dye-based materials or metal complex-based light-emitting materials.

Among the above light-emitting materials, examples of blue light-emitting materials may include distyrylarylene derivatives and polymerized products thereof, oxadiazole derivatives and polymerized products thereof, polyvinylcarbazole derivatives, poly-p-phenylene derivatives, polyfluorene derivatives and the like. Among these, polymer materials such as polyvinylcarbazole derivatives, poly-p-phenylene derivatives, and polyfluorene derivatives are preferred.

Among the above light-emitting materials, examples of green light-emitting materials may include quinacridone derivatives and polymerized products thereof, coumarin derivatives and polymerized products thereof, poly-p-phenylene vinylene derivatives, polyfluorene derivatives and the like. Among these, polymer materials such as poly-p-phenylene vinylene derivatives and polyfluorene derivatives are preferred.

Among the above light-emitting materials, examples of red light-emitting materials may include coumarin derivatives and polymerized products thereof, thiophene ring compounds and polymerized products thereof, poly-p-phenylene vinylene derivatives, polythiophene derivatives, polyfluorene derivatives. Among these, polymer materials such as poly-p-phenylene vinylene derivatives, polythiophene derivatives, and polyfluorene derivatives are preferred.

(Dopant Material)

Examples of the dopant material include perylene derivatives, coumarin derivatives, rubrene derivatives, quinacridone derivatives, squalium derivatives, porphyrin derivatives, styryl-based dyes, tetracene derivatives, pyrazolone derivatives, decacyclene, and phenoxazone. The thickness of such an organic light-emitting layer is generally about 2 nm to about 200 nm.

<Method for Forming Organic Light-Emitting Layer>

Any of a coating method using a solution containing the light-emitting material, a vacuum deposition method, a transferring method, or the like may be used as the method for forming the organic light-emitting layer. Any of the solvent used for film formation of the hole transport layer using the above-described solution may be used as the solvent for the film formation using a solution.

Examples of the coating method using a solution containing the light-emitting material may include: coating methods such as spin coating, casting, micro-gravure coating, gravure coating, bar coating, roll coating, wire bar coating, dip coating, slit coating, capillary coating, spray coating, and nozzle coating methods; and printing methods such as gravure printing, screen sprinting, flexographic printing, offset printing, reverse printing, and ink-jet printing methods. Printing methods such as gravure printing, screen sprinting, flexographic printing, offset printing, reverse printing, and ink-jet printing methods are preferred since pattern formation and multicolor printing are easy. When a low-molecular weight and sublimable compound is used, a vacuum deposition method may be used. The organic light-emitting layer may be formed only in desired areas by using a laser transferring method or a thermal transferring method.

<Electron Transport Layer>

Any known electron transport material may be used for the electron transport layer. Examples of such a material may include oxadiazole derivatives, anthraquinodimethane and derivatives thereof, benzoquinone and derivatives thereof, naphthoquinone and derivatives thereof, anthraquinone and derivatives thereof, tetracyanoanthraquinodimethane and derivatives thereof, fluorenone derivatives, diphenyldicyanoethylene and derivatives thereof, diphenoquinone derivatives, 8-hydroxyquinoline and metal complexes of derivatives thereof, polyquinoline and derivatives thereof, polyquinoxaline and derivatives thereof, and polyfluorene and derivatives thereof.

Among these, for example, oxadiazole derivatives, benzoquinone and derivatives thereof, anthraquinone and derivatives thereof, 8-hydroxyquinoline and metal complexes of derivatives thereof, polyquinoline and derivatives thereof, polyquinoxaline and derivatives thereof, and polyfluorene and derivatives thereof are preferably used as the electron transport material. More preferably, 2-(4-biphenylyl)-5-(4-t-butylphenyl)-1,3,4-oxadiazol), benzoquinone, anthraquinone, tris(8-quinolinol)aluminum, and polyquinoline are used.

No particular limitation is imposed on the method for forming the electron transport layer. Examples of the film formation method when a electron transport material having a low-molecular weight is used may include vacuum deposition using powder and film formation from a solution or molten state. Examples of the film formation method when a electron transport material having a high-molecular weight is used may include the film formation from a solution or molten state. When the film formation from a solution or molten state is used, a high molecular weight binder may also be used. To form the electron transport layer using a solution, for example, a film formation method similar to any of the above-described methods for forming the hole transport layer using a solution may be used.

The optimal thickness of the electron transport layer varies depending on the material used and is appropriately set such that appropriate driving voltage and light-emission efficiency are obtained, but the electron transport layer needs to have a thickness at least sufficient for preventing the formation of pinholes. When the thickness is too large, the driving voltage of the element becomes undesirably high. Therefore, the thickness of the electron transport layer is, for example, 1 nm to 1 μm, preferably 2 nm to 500 nm, and more preferably 5 nm to 200 nm.

<Electron Injection Layer>

The optimal material for the electron injection layer is appropriately selected according to the type of the organic light-emitting layer. Examples of such a material may include alkali metals; alkaline-earth metals; alloys containing at least one of alkali metals and alkaline-earth metals; oxides, halides, and carbonates of alkali metals and alkaline-earth metals; and mixtures of these materials. Examples of such alkali metals and the oxides, halides, and carbonates of the alkali metals may include lithium, sodium, potassium, rubidium, cesium, lithium oxide, lithium fluoride, sodium oxide, sodium fluoride, potassium oxide, potassium fluoride, rubidium oxide, rubidium fluoride, cesium oxide, cesium fluoride, and lithium carbonate. Examples of such alkaline-earth metals and the oxides, fluorides, and carbonates of the alkaline-earth metals may include magnesium, calcium, barium, strontium, magnesium oxide, magnesium fluoride, calcium oxide, calcium fluoride, barium oxide, barium fluoride, strontium oxide, strontium fluoride, and magnesium carbonate. The electron injection layer may be a stacked body of two or more layers, and may be LiF/Ca. The electron injection layer is formed by, for example, vapor deposition, sputtering, or a printing method. The thickness of the electron injection layer is preferably about 1 nm to about 1 μm.

<Reflecting Electrode>

A material having a high reflectivity for visible light is preferably used as the material for the reflecting electrode. For example, any of alkali metals, alkaline-earth metals, transition metals, and group IIIb metals may be used. Examples of the material for the reflecting electrode may include: metals such as lithium, sodium, potassium, rubidium, cesium, beryllium, magnesium, calcium, strontium, barium, aluminum, scandium, vanadium, zinc, yttrium, indium, cerium, samarium, europium, terbium, and ytterbium; alloys of two or more of the above metals; alloys of at least one of the above metals and at least one of gold, silver, platinum, copper, manganese, titanium, cobalt, nickel, tungsten, and tin; graphite; and intercalated graphite. Examples of the alloys may include magnesium-silver alloys, magnesium-indium alloys, magnesium-aluminum alloys, indium-silver alloys, lithium-aluminum alloys, lithium-magnesium alloys, lithium-indium alloys, and calcium-aluminum alloys.

The thickness of the reflecting electrode is appropriately set in consideration of the electric conductivity and durability and is, for example, 10 nm to 10 μm, preferably 20 nm to 1 μm, and more preferably 50 nm to 500 nm.

Examples of the method of producing the reflecting electrode may include vacuum vapor deposition, sputtering, and a laminate method in which a metal thin film is bonded by thermal-compression.

The organic EL element in the present embodiment may be used as a planar light source, light sources for segment display devices and dot-matrix display devices, and backlights of liquid crystal display devices. Therefore, a lighting device provided with the organic EL element and a display device provided with a plurality of the organic EL elements can be achieved.

As described above, since the organic EL element used has high light extraction efficiency, lighting devices and display devices having high brightness and low power consumption can be achieved.

When the organic EL element in the present embodiment is used as a planar light source, the flat anode and cathode are disposed so as to overlap each other as viewed from their stacking direction. To form an organic EL element that is used as the light source of a segment display device and emits patterned light, there are the following methods: a mask having a patterned window that allows light to pass therethrough is disposed on the planar light source; the organic layer is formed such that its extinction portions are formed to have an extremely large thickness to substantially prevent light from being emitted therefrom; or at least one of the anode and the cathode is formed into a pattern. A segment-type display device that can display numbers, characters, and simple symbols can be achieved by forming organic EL elements that emit patterned light using any of these methods and wiring their electrodes such that voltage can be selectively applied to desired electrodes. To use the organic EL elements as the light source of a dot-matrix display device, their anodes and cathodes are formed into stripes and arranged so as to be orthogonal to each other as viewed from a stacking direction. To achieve a partial color or multicolor dot-matrix display, an usable method may be: some types of light-emitting materials that emit different colors are applied to different areas; or a color filter, a fluorescent conversion filter, or the like is used. These dot-matrix display devices may be driven passively or actively in combination with TFTs or the like. These display devices may be used as display devices for computers, television sets, portable terminals, mobile phones, car navigations, viewfinders of video cameras, and the like.

The above light sources that are a surface-like form, are of the thin self-light-emitting type, and may be preferably used as a backlight for liquid crystal display devices or as a light source for lighting devices having a surface-like form. When a flexible substrate is used, the organic EL element may be used as a light source or a display device that have a curved form.

Example

As an example, an organic EL element using a High-N substrate provided with a light-scattering body was produced. The structure of the element was the light-scattering body (p-$TiO_2$)/the substrate (0.7 mm)/ITO (100 nm)/α-NPB (50 nm)/$Alq_3$ (60 nm)/LiF/Al (200 nm). The symbol "/" means that layers sandwiching the symbol "/" are stacked adjacent to each other. The same is applied to the following description.

A K-PSNF2 substrate having a refractive index of 2.02, product of Sumita Optical Glass Inc., was used. The light-scattering body was formed of porous titanium oxide and produced by the sol-gel method. First, titanium tetraisopropoxide (TTIP: [$(CH_3)_2CHO]_4Ti$) serving as a titanium alkoxide raw material and ethanol were mixed in a molar ratio of 1:4, and the mixture was stirred at 20° C. for 10 minute, thus obtaining solution A. Ethanol and water were mixed in a molar ratio of 4:1, and the mixture was stirred at 20° C. for 10 minutes, thus obtaining solution B. Further, the solutions A and B were mixed in a molar ratio of 1:1, and the mixture was stirred at 20° C. for 60 minutes to hydrolyze the titanium alkoxide, whereby a titania sol was obtained. The titania sol was applied to the surface of the substrate by the spin coating method. The substrate was rotated at a rotation speed of 4000 rpm for 20 seconds to form a thin film having a thickness of 70 nm. Then, the resultant thin film was dried at 120° C. for 10 minutes, and a thin film of the light-scattering body was formed. The thin film was observed under a scanning electron microscope, and the size of the pores was found to be in the range of 500 nm to 1000 nm.

The ITO thin film was formed by the sputtering method, and the α-NPB layer, $Alq_3$ layer, LiF layer, and Al layer were formed by the vapor deposition method. The obtained organic EL element is referred to as an element of Example.

Comparative Example 1 was performed, which produced the same element as the element of Example except that the light-scattering body was omitted.

Comparative Example 2 was performed, which produced the same element as the element of Example except that a different substrate was used. The substrate used for the element of Comparative Example 2 was a substrate having a refractive index of 1.52, named #1737, a product of Corning Incorporated. Comparative Example 3 was performed, which produced the same element as the element of Comparative Example 2 except that the light-scattering body was omitted.

The element of Example and the elements of Comparative Examples 1 to 3 were different only in their substrate structures. Each of the substrate structures is shown in Table 1 below.

TABLE 1

|  | REFRACTIVE INDEX OF SUBSTRATE | LIGHT-SCATTERING BODY |
| --- | --- | --- |
| ELEMENT OF EXAMPLE | 2.02 | INCLUDED |
| ELEMENT OF COMPARATIVE EXAMPLE 1 | 2.02 | NONE |
| ELEMENT OF COMPARATIVE EXAMPLE 2 | 1.52 | INCLUDED |
| ELEMENT OF COMPARATIVE EXAMPLE 3 | 1.52 | NONE |

(Evaluation of Elements)

Each element was irradiated with a light of a wavelength of 390 nm, and the light intensity of the total luminous flux emitted from the element was measured.

The ratio determined by: (the light intensity of the total luminous flux from the element of the Example)/(the light intensity of the total luminous flux from the element of the Comparative Example 1) was 2.6. The ratio determined by: (the light intensity of the total luminous flux from the element of the Comparative Example 2)/(the light intensity of the total luminous flux from the element of the Comparative Example 3) was 2.0. In other words, when the light-scattering body was provided on the high-refractive index substrate, the light extraction efficiency was improved 2.6-hold. When the light-scattering body was provided on the low-refractive index substrate, the light extraction efficiency was improved 2.0-hold. The light extraction efficiency was determined from the light intensity of the total luminous flux, and was 53% for the element of the Example and 40% for the element of the Comparative Example 2. As described above, it was found that, by providing the light-scattering body on the high-refractive index substrate, the light extraction efficiency was significantly improved as compared to the case where the light-scattering body was provided on the low-refractive index substrate.

Reference Example

An Example of Simulation

Figure 5:
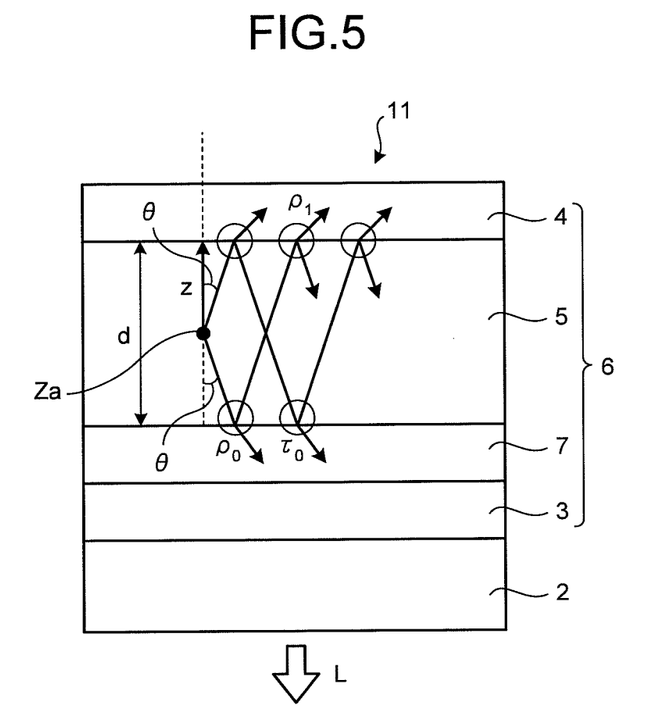
FIG. 5 is a diagram illustrating an example of a layered structure of an organic EL element used for a simulation and parameters used therefor.

Hereinafter, a description is given of an exemplary layered structure of an organic EL element shown in FIG. 5 that is used for the simulation, of parameters used for the simulation, and of a specific simulation method according to the flow-chart of the simulation shown in FIG. 6. The organic EL element 11 shown in FIG. 5 is a so-called bottom emission type in which light L is extracted from the substrate 2 side, and this corresponds to an embodiment having a structure in which the light-scattering body 2a is omitted from the organic EL element 1 shown in FIG. 1.

(Light Interference Calculation)

Light emitted from a certain point in the organic light-emitting layer 5 is repeatedly reflected from and passes through the interfaces between the layers, and then is extracted. A multilayer film (the hole transport layer 7 and the transparent electrode 3) on the front side (light-extraction side) is treated as a single layer (front-side layer) having a reflection characteristic and a transmission characteristic (hereinafter, these may be referred to as reflection-transmission characteristics) the same as the characteristics of the multilayer film. In this example, the layer (the reflecting electrode 4) on the rear side (the side opposite to the light extraction side) is treated similarly.

Light of wavelength $\lambda$ is emitted from a point (the point $Z_a$ spaced apart from the rear-side electrode that is the reflecting electrode 4, is a distance z) inside the organic light-emitting layer 5 (thickness d) at a direction θ. The energy ratio T(λ, θ, z) of the light extracted to the front side is calculated in consideration of the multiple reflection at the front-side layer and the rear-side layer and the multiple interference between light waves transmitted through the front-side layer. The energy ratio T(λ, θ, z) is represented by the following equation (1).

[Equation 1]

$$T = \frac{(1-|\rho_0|^2)\{1+|\rho_1|^2+2|\rho_1|\cos(2\delta_1-\varphi_1)\}}{1+|\rho_0|^2|\rho_1|^2-2|\rho_0||\rho_1|\cos(2\delta_0-\varphi_0-\varphi_1)} \quad (1)$$

The parameters necessary for the computation in the above equation (1) are: the amplitude reflectance $\rho_0$ at the interface between the organic light-emitting layer and the front-side layer; the phase shift $\phi_0$ at front-side reflection; the amplitude transmittance $\tau_0$; the amplitude reflectance $\rho_1$ at the interface between the organic light-emitting layer and the rear-side layer; the phase shift $\phi_1$ at rear-side reflection; and the phase shifts $\delta_0$ and $\delta_1$ resulted from two optical lengths at the direction θ. The amplitude transmittance τ is not used in the above equation (1) but is used in its derivation process. The phase shifts are represented by the following set of equations (2).

[Equation 2]

$$\begin{cases} \delta_0 = \frac{2\pi}{\lambda} nd\cos\theta_1 \\ \delta_1 = \frac{2\pi}{\lambda} nz\cos\theta_1 \end{cases} \quad (2)$$

In the above equations, $\phi_0$, $\phi_1$, $\delta_0$, and $\delta_1$ are as follows.
$\phi_0$: Phase shift at a reflection from the front-side layer
$\phi_1$: Phase shift at a reflection from the rear-side layer
$\delta_0$: Phase shift due to the thickness of the light-emitting layer
$\delta_1$: Phase shift due to the distance between the light-emitting point and the rear-side layer The rest of the parameters can be determined from the parameters of the respective layers included in the aiming multilayer film by using a characteristic matrix method.

(Characteristic Matrix Method)

Generally, the reflection-transmission characteristics of a multilayer film can be represented as the reflection-transmission characteristics of an equivalent single layer. The reflection-transmission characteristics of the equivalent single layer can be systematically represented by using the characteristic matrixes of the layers included in the multilayer film.

The characteristic matrix Mj(λ, θ) of j-th layer, which constitutes the multilayer film, for the light having wavelength λ and moving forward at a direction θj, can be represented by the following equation (3) by using the refractive index $n_j(\lambda)$ and thickness $d_j$ of the material forming the j-th layer.

[Equation 3]

$$M_j = \begin{bmatrix} \cos\delta_j & i\sin\delta_j/n_j \\ in_j\sin\delta_j & \cos\delta_j \end{bmatrix} = \begin{bmatrix} m(j)_{11} & im(j)_{12} \\ im(j)_{21} & m(j)_{22} \end{bmatrix} \quad (3)$$

$\delta_j$ is a phase shift corresponding to the optical length of the j-th layer and is a quantity represented by the following equation (4).

[Equation 4]

$$\delta_j = \frac{2\pi}{\lambda} n_j d_j \cos\theta_j \quad (4)$$

The direction of the light proceeding θj in the each layer is linked by the Snell's law.

[Equation 5]

$$n_j \sin\theta_j = \text{constant} \quad (5)$$

The characteristic matrix of the stacked structure is obtained by multiplying the characteristic matrixes $M_j$ of the respective layers in the stacking order.

[Equation 6]

$$M = M_1 \cdot M_2 \ldots M_j \ldots M_L = \begin{bmatrix} m_{11} & im_{12} \\ im_{21} & m_{22} \end{bmatrix} \quad (6)$$

In the organic EL element, the characteristic matrix of the front-side layer and the characteristic matrix of the rear-side layer are calculated by using the above method and used. In the example shown in FIG. 5, the front-side layer is composed of a front-side organic layer (such as the hole transport layer 7), the transparent conductive electrode 3 and the like. The rear-side layer is composed of the reflecting electrode 4. (The same is applied when other organic layers such as an electron injection layer and an electron transport layer are provided on the rear side.)

The amplitude reflectance ρ of the multilayer film is obtained by using the above characteristic matrix as follows. First, B and C defined by the following equation (7) are calculated.

[Equation 7]

$$\begin{bmatrix} B \\ C \end{bmatrix} = \begin{bmatrix} m_{11} & im_{12} \\ im_{21} & m_{22} \end{bmatrix} \begin{bmatrix} 1 \\ \eta_s \end{bmatrix} = \begin{bmatrix} m_{11} + i\eta_s m_{12} \\ im_{21} + \eta_s m_{22} \end{bmatrix} \quad (7)$$

Here, $\eta_s$ is the optical admittance of the substrate and is represented by $\eta_s = n_s \cos\theta_s$ for s-polarized light, and is represented by $\eta_s = n_s/\cos\theta_s$ for p-polarized light (equation (8) below).

[Equation 8]

$$\eta_s = \begin{Bmatrix} \eta_s \cos\theta_s \\ \eta_s/\cos\theta_s \end{Bmatrix} \quad (8)$$

The amplitude reflectance ρ (also referred to as a Fresnel reflection coefficient or an effective Fresnel coefficient) of the multilayer film can be calculated from B and C determined by using the above method and from the following equation (9).

[Equation 9]

$$\rho = \frac{\eta_0 B - C}{\eta_0 B + C} = \frac{Q_1 - iQ_2}{Q_3 - iQ_4} \quad (9)$$

Here, $\eta_0$ is the optical admittance of a medium on the incident side to the multilayer film and is generally the refractive index of the medium.

The energy reflectance of the multilayer film can be determined from the amplitude reflectance by using the following equations (10).

[Equation 10]

$$\begin{cases} R = |\rho|^2 = \dfrac{Q_1^2 + iQ_2^2}{Q_3^2 - iQ_4^2} \\ \phi = \tan^{-1} \dfrac{Q_1 Q_4 - Q_2 Q_3}{Q_1 Q_3 + Q_2 Q_4} \end{cases} \quad (10)$$

The energy reflectance of each of the front-side layer and the rear-side layer can be calculated by using the above equations (equations (11)).

[Equation 11]

$$\begin{cases} \rho_0 = |\rho_0| e^{i\varphi_0} \\ \rho_1 = |\rho_1| e^{i\varphi_1} \\ \tau_0 = |\tau_0| e^{i\varphi_\tau} \end{cases} \quad (11)$$

$|\rho_0|^2$ and $|\rho_1|^2$ are as follows.

$|\rho_0|^2 = R_0$: Energy reflectance at the interface of the front-side layer $|\rho_1|^2 = R_1$: Energy reflectance at the interface of the rear-side layer To calculate the energy ratio T extracted to the front side of the organic EL element, the amplitude reflectances $\rho_0$ and $\rho_1$ determined for the front-side and rear-side layers are put to the equation (1).

(Integration Over Light-Emitting Area)

The external emission energy $T(\lambda, \theta, z)$ at wavelength $\lambda$ and angle $\theta$ with the light-emitting point fixed at z is determined by applying the calculation of the characteristic matrix and the multiple interference described above (Equation (1)). Then $T(\lambda, \theta, z)$ is integrated with respect to the light-emitting point z over the entire light-emitting area (the entire thickness of the light-emitting layer when the entire light-emitting layer emits light), and thereby external emission energy $T_A(\lambda, \theta)$ from the entire light-emitting area is determined.

(Calculation of Influence of Substrate)

The influence of the substrate to the obtained external emission energy $T_A(\lambda, \theta)$ is calculated, thereby determining the external emission energy $T_{A+S}(\lambda, \theta)$. The influence of the substrate can be determined by the calculation using the refractive index of the substrate and the direction of light proceeding, without taking into the consideration the phase of light. The value of $T_{A+S}(\lambda, \theta)$ corresponds to the external mode. The value of $T_A(\lambda, \theta) - T_{A+S}(\lambda, \theta)$ is the energy of light trapped in the substrate and corresponds to the substrate mode.

(Calculation of Light-Emission Spectrum and Angular Dependence Thereof)

The above calculation of $T_{A+S}(\lambda, \theta)$ is repeated at different wavelengths $\lambda$ to obtain a light-emission spectrum at angle $\theta$. The angular dependence of the light-emission spectrum can be determined by repeating the calculation at different angles $\theta$.

(Flowchart of Calculation)

Figure 6:
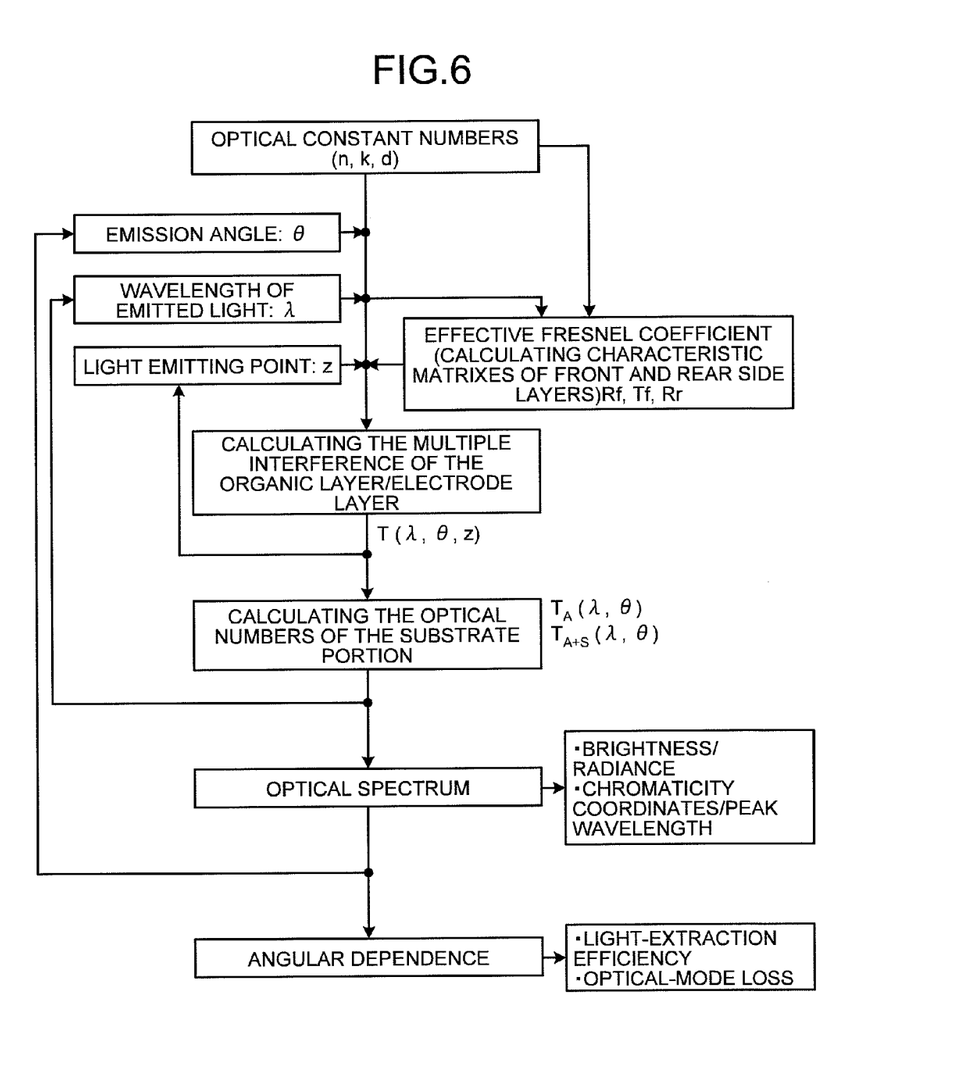
FIG. 6 is an exemplary flowchart of the simulation.

The above series of calculation may be performed, for example, according to the procedure shown in the flowchart in FIG. 6.

The invention claimed is:

1. An organic electroluminescent element comprising:
   a substrate being transparent and having a refractive index of 1.8 or more;
   a stacked body that is provided on the substrate and includes a pair of electrodes and an organic light-emitting layer located between the pair of electrodes; and
   a porous light-scattering body that is provided on a surface of the substrate, the surface being opposite to the stacked body, wherein
   the porous light-scattering body is a titania film consisting essentially of titania, the film being formed by applying a titania sol produced by hydrolysis and polymerization of a titanium alkoxide to the substrate to form a film, and
   wherein when alight emitted from the organic light-emitting layer and guided by and trapped in the substrate is defined as a substrate mode, a distance between the electrodes is set to a length that gives a local maximum of the substrate mode under a condition where the light-scattering body is not provided.

2. A lighting device comprising the organic electroluminescent element according to claim 1.

3. A display device comprising a plurality of organic electroluminescent elements according to claim 1.

4. The organic electroluminescent element, of claim 1, wherein the size of pores formed in the porous light-scattering body is 400 nm to 1000 nm.

5. The organic electroluminescent element of claim 1, wherein a difference between a refractive index n1 of the substrate and a refractive index n2 of an electrode on the light-extraction side of the pair of electrodes (n1-n2) is −0.1 or more.

* * * * *